United States Patent
Lim et al.

(10) Patent No.: US 12,232,417 B2
(45) Date of Patent: Feb. 18, 2025

(54) ORGANIC LIGHT EMITTING DEVICE AND ORGANIC LIGHT EMITTING DISPLAY

(71) Applicant: LG Display Co., Ltd., Seoul (KR)

(72) Inventors: Dong-Hyeok Lim, Goyang-si (KR); Jin-Ho Park, Goyang-si (KR)

(73) Assignee: LG Display Co., Ltd., Seoul (KR)

(*) Notice: Subject to any disclaimer, the term of this patent is extended or adjusted under 35 U.S.C. 154(b) by 497 days.

(21) Appl. No.: 16/216,192

(22) Filed: Dec. 11, 2018

(65) Prior Publication Data
US 2019/0207122 A1 Jul. 4, 2019

(30) Foreign Application Priority Data
Dec. 29, 2017 (KR) .................. 10-2017-0183503

(51) Int. Cl.
| | | |
|---|---|---|
| *H10K 50/16* | (2023.01) | |
| *H10K 50/11* | (2023.01) | |
| *H10K 85/60* | (2023.01) | |
| *H10K 50/15* | (2023.01) | |
| *H10K 50/17* | (2023.01) | |
| *H10K 50/18* | (2023.01) | |
| *H10K 101/40* | (2023.01) | |

(52) U.S. Cl.
CPC ......... *H10K 85/6572* (2023.02); *H10K 50/11* (2023.02); *H10K 85/615* (2023.02); *H10K 85/626* (2023.02); *H10K 85/654* (2023.02); *H10K 50/15* (2023.02); *H10K 50/166* (2023.02); *H10K 50/171* (2023.02); *H10K 50/18* (2023.02); *H10K 2101/40* (2023.02)

(58) Field of Classification Search
CPC ... H01L 51/508; H01L 51/5072; H10K 50/16; H10K 50/166
See application file for complete search history.

(56) References Cited

U.S. PATENT DOCUMENTS

| | | | |
|---|---|---|---|
| 9,105,858 B2 | 8/2015 | Kambe et al. | |
| 9,502,669 B2 | 11/2016 | Huh et al. | |
| 10,074,809 B2 | 9/2018 | Jang et al. | |
| 10,093,852 B2 | 10/2018 | Huh et al. | |
| 2005/0218792 A1* | 10/2005 | Jianpu | H01L 27/3213 313/502 |
| 2010/0193773 A1* | 8/2010 | Yamamoto | C07D 401/10 257/40 |
| 2011/0215308 A1* | 9/2011 | Im | H01L 51/006 257/40 |
| 2013/0112949 A1* | 5/2013 | Sim | H01L 51/508 438/22 |
| 2014/0065750 A1* | 3/2014 | Harikrishna Mohan | H10K 50/125 438/35 |
| 2018/0066180 A1* | 3/2018 | Huh | H01L 51/5203 |

FOREIGN PATENT DOCUMENTS

| | | |
|---|---|---|
| CN | 101859874 A | 10/2010 |
| CN | 106459745 A | 2/2017 |
| CN | 106716665 A | 5/2017 |
| CN | 107431141 A | 12/2017 |

(Continued)

*Primary Examiner* — Sean M DeGuire
(74) *Attorney, Agent, or Firm* — Seed IP Law Group LLP

(57) ABSTRACT

Provided are an organic light emitting device with improved UV lifespan, based on changed configuration of an electron transport layer, and an organic light emitting display including the same.

12 Claims, 12 Drawing Sheets

(56) References Cited

FOREIGN PATENT DOCUMENTS

| | | | |
|---|---|---|---|
| EP | 1777759 | A2 | 4/2007 |
| EP | 2365555 | A2 | 9/2011 |
| JP | 2007115662 | A | 5/2007 |
| KR | 10-2008-0012411 | A | 2/2008 |
| KR | 20100054170 | A | 5/2010 |
| KR | 20110101418 | A | 9/2011 |
| KR | 10-2012-0096382 | A | 8/2012 |
| WO | WO-2016171406 | A2 * | 10/2016 ............. C09K 11/06 |

* cited by examiner

ORGANIC LIGHT EMITTING DEVICE AND ORGANIC LIGHT EMITTING DISPLAY

CROSS-REFERENCE TO RELATED APPLICATION

This application claims the benefit of Korean Patent Application No. 10-2017-0183503, filed on Dec. 29, 2017, which is hereby incorporated by reference as if fully set forth herein.

BACKGROUND

Technical Field

The present disclosure relates to an organic light emitting device, more particularly, to an organic light emitting device which can be stably operated under harsh conditions and an organic light emitting display including the same.

Description of the Related Art

Owing to advantages of reduced size and weight, flat panel displays are widely used for monitors of desktop computers, as well as notebook computers, portable computers such as PDAs or cellular phones. These flat panel displays include liquid crystal displays (LCDs), plasma display panels (PDPs), field emission displays (FEDs), organic light emitting displays (OLEDs) and the like.

Thereamong, organic light emitting displays have a rapid response speed, excellent brightness based on high luminous efficiency and a wide viewing angle.

Meanwhile, organic light emitting displays can be utilized in various applications including smart watches, cellular phones, navigation systems and various exploration equipment. In addition, these applications need to stably operate even under harsh environments including serious exposure to sunshine since they may be directly exposed to indoor environments as well as outdoor environments.

However, recent organic light emitting displays have a problem of undergoing rapid deterioration in lifespan upon operation under harsh environments of prolonged UV exposure, since they are produced to have an indoor display function.

BRIEF SUMMARY

Accordingly, the present disclosure is directed to an organic light emitting device and an organic light emitting display including the same that substantially obviate one or more problems due to limitations and disadvantages of the related art.

It is an object of the present disclosure to provide an organic light emitting device with improved UV lifespan, based on changed configuration of an electron transport layer, and an organic light emitting display including the same.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

The present disclosure can improve efficiency and UV lifespan by changing the configuration and materials of the electron transport layer.

To achieve these objects and other advantages and in accordance with the purpose of the disclosure, as embodied and broadly described herein, an organic light emitting device includes an anode and a cathode opposing each other, a light emitting layer interposed between the anode and the cathode, a hole transport layer interposed between the anode and the light emitting layer, and an electron transport layer interposed between the light emitting layer and the cathode and including a first electron transport layer comprising a benzimidazole derivative and a compound of Formula 1, and a second electron transport layer comprising the compound of Formula 1 and the benzimidazole derivative is absent, wherein the compound of Formula 1 has the following structure:

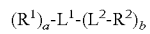   Formula 1 wherein a and b are each independently 1, 2 or 3, $L^1$ is, at each occurrence, independently a substituted or unsubstituted divalent, trivalent, or tetravalent arylene group, $L^2$ is a direct bond or a substituted or unsubstituted arylene group, $R^2$ is a unsubstituted aryl or an aryl substituted with 1, 2, or 3 cyano substituents, and $R^1$ is a substituted or unsubstituted heteroaryl group.

In addition, the first and second electron transport layers may be in contact each other, the first electron transport layer may be positioned more distal to the cathode relative to the second electron transport layer and the second electron transport layer may be positioned more proximal to the cathode.

The organic light emitting device may further include an electron injection layer between the second electron transport layer and the cathode, wherein the second electron transport layer and the cathode are each in contact with a different surface of the electron injection layer.

The organic light emitting device may further include a third electron transport layer consisting essentially of the benzimidazole derivative, wherein the third electron transport layer is in contact with a surface of the first electron transport layer and is not in contact with the second electron transport layer.

Alternatively, the electron transport layer may include the electron transport layer comprises a plurality of electron transport layer groups, wherein each electron transport layer group comprising the first electron transport layer, the second electron transport layer in contact with a first surface of the first electron transport layer, and a third electron transport layer consisting essentially of the benzimidazole derivative in contact with a second surface of the first electron transport layer.

Among the electron transport layers, the first and second electron transport layers are in contact with each other; the first electron transport layer is positioned to be more distal to the cathode relative to the second electron transport layer; and the second electron transport layer is positioned to be more proximal to the cathode relative to the first electron transport layer.

In addition, the first electron transport layer may be thicker than the second electron transport layer.

In addition, the benzimidazole derivative may have a LUMO energy level ranging from −3.0 eV to −2.9 eV, and the compound of Formula 1 has a LUMO energy level ranging from −3.2 eV to −3.1 eV.

The heteroaryl group ($R^1$) may be represented by the following Formula A or B:

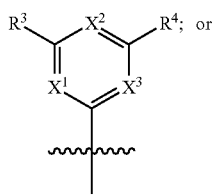

Formula A

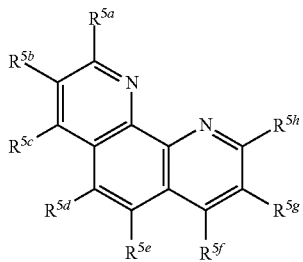

Formula B wherein $X^1$, $X^2$ and $X^3$ are, at each occurrence, independently N, CH or CD provided that at least one of $X^1$, $X^2$ or $X^3$ is N; $R^3$ and $R^4$ are, at each occurrence, independently hydrogen, or a substituted or unsubstituted aryl group; $R^{5a}$, $R^{5b}$, $R^{5c}$, $R^{5d}$, $R^{5e}$, $R^{5f}$, $R^{5g}$, and $R^{5h}$ are, at each occurrence, independently a direct bond to $L^1$, hydrogen, a substituted or unsubstituted aryl group, or two of $R^{5a}$, $R^{5b}$, $R^{5c}$, $R^{5d}$, $R^{5e}$, $R^{5f}$, $R^{5g}$, and $R^{5h}$ may join with each other, along with the carbon to which they are attached, to form a substituted or unsubstituted carbocyclic or heterocyclic ring.

In addition, the benzimidazole derivative may be represented by the following Formula 2:

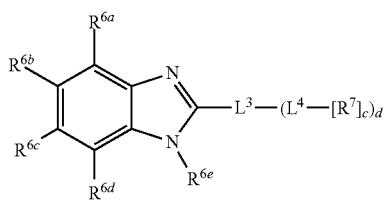

Formula 2 wherein $R^{6a}$, $R^{6b}$, $R^{6c}$, $R^{6d}$, and $R^{6e}$ are each independently selected from the group consisting of substituted or unsubstituted $C_1$-$C_{60}$ alkyl, substituted or unsubstituted aryl, and substituted or unsubstituted 5 to 7-atom heterocyclyl; $L^3$ and $L^4$ are each independently a direct bond or a substituted or unsubstituted divalent, trivalent, or tetravalent arylene group; $R^7$ is a substituted or unsubstituted aryl group; c is, at each occurrence, independently 1, 2, or 3; and d is 1, 2, or 3.

In addition, an absolute value of a LUMO level of the compound of Formula 1 may be higher than an absolute value of a LUMO level of the benzimidazole derivative and is lower than a work function of the cathode.

Meanwhile, a first electron mobility of the benzimidazole derivative may be higher than a second electron mobility of the compound of Formula 1.

In another aspect of the present disclosure, provided is an organic light emitting display including a substrate having a plurality of sub-pixels positioned on a surface of the substrate, a thin film transistor in each sub-pixel on the surface of the substrate, and the organic light emitting device connected to the thin film transistor and an anode.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Figure 1:
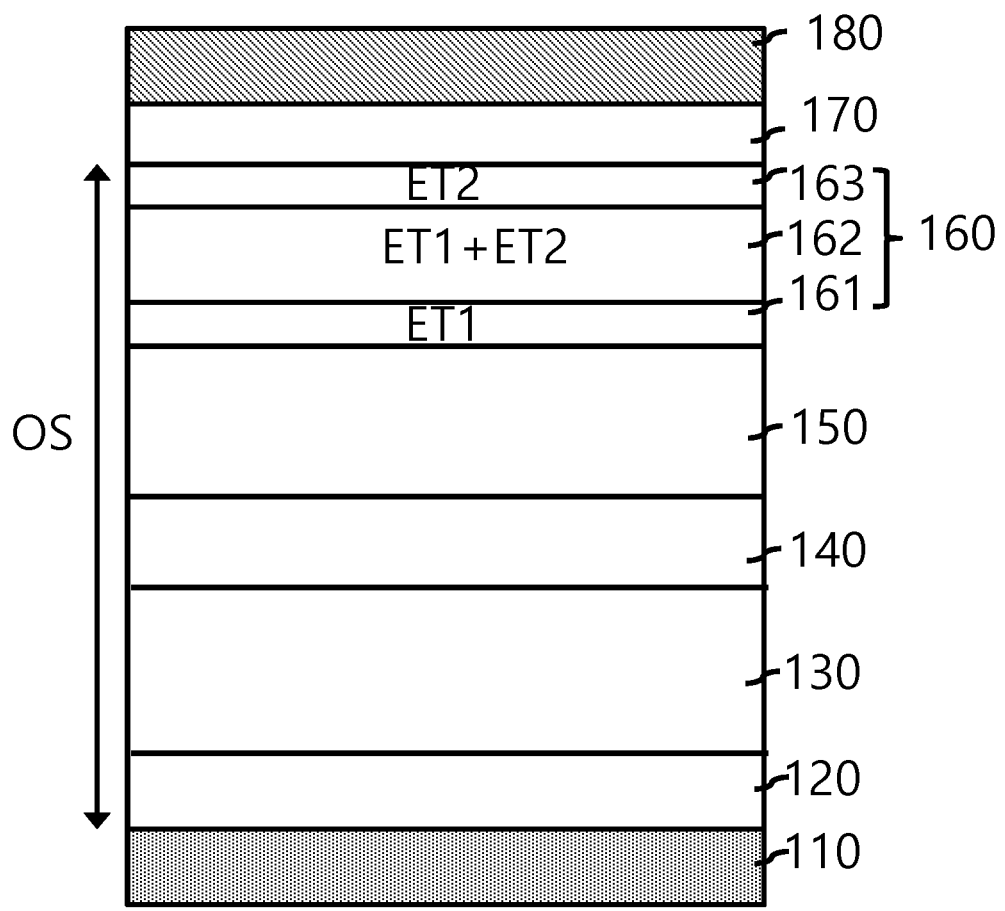
FIG. 1 is a sectional view illustrating an organic light emitting device according to the present disclosure.

Reference will now be made in detail to the preferred embodiments of the present disclosure, examples of which are illustrated in the accompanying drawings.

The advantages, features and methods of achieving the same of the present disclosure will be more clearly understood from the following detailed description taken in conjunction with the accompanying drawings. However, the present disclosure is not limited to a variety of embodiments described below and can be implemented in various forms. The embodiments of the present disclosure are provided only to completely disclose the present disclosure and fully inform a person having ordinary knowledge in the field to which the present disclosure pertains of the scope of the present disclosure. Accordingly, the present disclosure is defined by the scope of the claims.

The shape, size, ratio, angle, number and the like shown in the drawings to illustrate the embodiments of the present disclosure are only for illustration and are not limited to the contents shown in the drawings. Wherever possible, the same reference numbers will be used throughout the drawings to refer to the same or like parts. In the following description, detailed descriptions of technologies or configurations related to the present disclosure may be omitted so as not to unnecessarily obscure the subject matter of the present disclosure. When terms such as "including", "having" and "comprising" are used throughout the specification, are to be construed in an open, inclusive sense, that is, as "including, but not limited to". As used herein, the phrase "consisting of" excludes any element, step, ingredient, or component that is not specified. As used herein, the phrase "consisting essentially of" limits the scope of the embodiment to the specified elements, steps, ingredients, or components, and to those that do not materially affect the basic and novel characteristics of the claimed disclosure. A component described in a singular form encompasses components in a plural form unless particularly stated otherwise.

It should be interpreted that the components included in the embodiments of the present disclosure include an error range, although there is no additional particular description.

In describing a variety of embodiments of the present disclosure, when terms for positional relationships such as "on", "above", "under", "proximal", "distal", and "next to" are used, at least one intervening element may be present between two elements unless "immediately" or "directly" is used. "Proximal" or "more proximal" refers to a positional relationship that is closer and may refer to a position relative to another element. "Distal" and "more distal" refers to a positional relationship that is further way and may refer to a position relative to another element.

In describing a variety of embodiments of the present disclosure, when terms related to temporal relationship, such as "after", "subsequently", "next" and "before", a non-continuous case may be present, unless "immediately" or "directly" is used.

In describing a variety of embodiments of the present disclosure, terms such as "first" and "second" may be used to describe a variety of components, but these terms only aim to distinguish the same or similar components from one another. Accordingly, throughout the specification, a "first" component may be the same as a "second" component within the technical concept of the present disclosure, unless specifically mentioned otherwise.

Throughout the specification, "LUMO (lowest unoccupied molecular orbital) energy level" and "HOMO (highest occupied molecular orbital) energy level" of any layer means LUMO and HOMO energy levels of a material which occupies most of a weight ratio of the corresponding layer, for example, a host material, unless LUMO and HOMO energy levels of a dopant doped in the corresponding layer are referred.

Throughout the specification, the term "HOMO energy level" means an energy level which is measured by cyclic voltammetry (CV) that determines an energy level from a relative voltage of a reference electrode having a known potential. For example, a HOMO energy level of any material can be measured based on, as the reference electrode, ferrocene having known oxidation and reduction potentials.

"Arylene" refers to a cyclic group comprising one or more aromatic rings and can refer to a linker that connects two or more parts of a molecule. For example, when an arylene connects two parts of a molecule, it is referred to as "diavalent"; when 3 parts of a compound connected by an arylene, it is referred to as "trivalent"; similarly, when connecting 4 parts, it is referred to as "tetravalent." Arylene groups include, but are not limited to benzene, naphthalene, anthracene, phenanthrene, chrysene, pyrene, corannulene, foronene, and the like.

The respective features of various embodiments according to the present disclosure can be partially or entirely joined or combined and technically variably related or operated, and the embodiments can be implemented independently or in combination.

Meanwhile, throughout the specification, the organic light emitting device is, for example, implemented in the form of a single stack, but may be in the form of a plurality of stacks, between which a change generation layer is interposed. Each stack means a unit structure which includes a hole transport layer, an organic layer including the hole transport layer, and an organic light emitting layer disposed between the hole transport layer and an electron transport layer. The organic layer may further include a hole injection layer, an electron blocking layer, a hole blocking layer and an electron injection layer, and may further include other organic layers depending on the structure or design of the organic light emitting device.

Hereinafter, preferred embodiments of the present disclosure will be described with reference to the annexed drawings.

Hereinafter, an organic light emitting device and an organic light emitting display including the same will be described in more detail with reference to the annexed drawings.

FIG. 1 is a sectional view illustrating an organic light emitting device according to the present disclosure.

As shown in FIG. 1, the organic light emitting device according to the present disclosure includes an anode 110 and a cathode 180 opposing each other, a light emitting layer 150 interposed between the anode and the cathode, a hole transport layer 130 interposed between the anode and the light emitting layer, and an electron transport layer 160 including a first electron transport layer 162 interposed between the light emitting layer 150 and the cathode 180, and including a mixture of a benzimidazole derivative and of a compound of Formula 1, and a second electron transport layer 163 made of only the compound of Formula 1.

As shown in FIG. 1, in addition to the aforementioned elements, the organic light emitting device may further include a hole injection layer 120 between the anode 110 and the hole transport layer 130, an electron injection layer 170 between the electron transport layer 160 and the cathode 180, and an electron blocking layer 140 between the hole transport layer 130 and the light emitting layer 150. However, these injection layers 120 and 170, and the electron blocking layer 140 may be omitted, if necessary and, in addition to these layers, the hole transport layer 130 and the electron transport layer 160 may include two or more layers of different materials, or further include an additional control layer adjacent thereto.

The layers, excluding the light emitting layer 150 between the anode 110 and the cathode 180, function to transport holes and electrons to the light emitting layer 150 and thereby induce recombination between holes and electrons in the light emitting layer 150. Substantially, layers interposed between the anode 110 and the light emitting layer 150 help inject holes into the light emitting layer and transport holes thereto, and layers interposed between the light emitting layer 150 and the cathode 180 help inject electrons into the light emitting layer and transport electrons thereto.

The organic light emitting device according to the present disclosure is characterized by the electron transport layer 160.

The electron transport layer 160 shown in FIG. 1 further includes, in addition to the first electron transport layer 162 and the second electron transport layer 163, a third electron transport layer 161 including only the benzimidazole derivative adjacent to the light emitting layer 150, because, when the benzimidazole derivative and the compound of Formula 1 are codeposited in general codeposition equipment, in a formation direction, a single layer of the benzimidazole derivative is first formed, a mixed layer of the benzimidazole derivative and compound of Formula 1 is formed and a single layer of the compound of Formula 1 is then formed. When the mixed layer can be formed without formation of the single layer, the third electron transport layer 161 can be omitted.

The benzimidazole derivative and compound of Formula 1, which are materials contained in the electron transport layer 160, exclude materials vulnerable to UV, such as lithium quinolate (Liq). That is, the benzimidazole derivative and compound of Formula 1 used for the electron transport layer 160 according to the present disclosure are materials which are found not to change absorbance even upon prolonged UV exposure (see FIGS. 6B and 6C).

In addition, specifically, the second electron transport layer 163 adjacent to the cathode 180 includes a single material of a compound of Formula 1:

Formula 1 wherein a and b are each independently 1, 2 or 3, $L^1$ is, at each occurrence, independently a substituted or unsubstituted divalent, trivalent, or tetravalent arylene group, $L^2$ is a direct bond or a substituted or unsubstituted arylene group, $R^2$ is a unsubstituted aryl or an aryl substituted with 1, 2, or 3 cyano (—CN) substituents, and $R^1$ is a substituted or unsubstituted heteroaryl group.

The compound represented by Formula 1 has a LUMO energy level of about −3.10 to −3.20 eV and thus has a lower LUMO energy level (a greater absolute value of LUMO energy level) than the lithium quinolate compound. Accordingly, the LUMO energy level of the compound is similar to the work function of the metal used for the cathode 180, thereby functioning to reduce barrier upon injection of electrons from the cathode 180. In order to reduce the electron injection barrier, the compound of Formula 1 should be disposed as a single material adjacent to the cathode 180. As shown in FIG. 1, the second electron transport layer 163 is formed by supplying only a material for the compound of Formula 1 in the last step of codepositing the benzimidazole derivative and the compound of Formula 1 and is a thin layer which is at most ⅕$^{th}$ as thick as the codeposited first electron transport layer 162. The first and second electron transport layers 162 and 163 are formed in the continuous codeposition process and contact each other.

In a structure not including the electron injection layer 170, the second electron transport layer 163 may directly contact the cathode 180 and, in a structure including the electron injection layer 170, the second electron transport layer 163 and the cathode 180 may contact both surfaces of the electron injection layer 170.

In addition, specifically, the heteroaryl ($R^1$) group may be represented by the following Formula A or B:

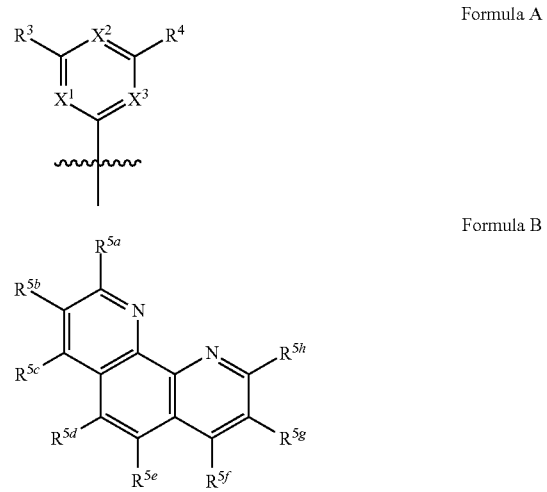

Formula A

Formula B

In Formulae A and B, $X^1$, $X^2$ and $X^3$ are, at each occurrence, independently N, CH or CD provided that at least one of $X^1$, $X^2$ or $X^3$ is N; $R^3$ and $R^4$ are, at each occurrence, independently hydrogen, a substituted or unsubstituted aryl group; $R^{5a}$, $R^{5b}$, $R^{5c}$, $R^{5d}$, $R^{5e}$, $R^{5f}$, $R^{5g}$, and $R^{5h}$ are, at each occurrence, independently a direct bond to $L^1$, hydrogen, a substituted or unsubstituted aryl group, or two of $R^{5a}$, $R^{5b}$, $R^{5c}$, $R^{5d}$, $R^{5e}$, $R^{5f}$, $R^{5g}$, and $R^{5h}$ may join with each other, along with the carbon to which they are attached, to form a substituted or unsubstituted carbocyclic or heterocyclic ring.

That is, since the benzimidazole derivative codeposited with the compound of Formula 1 in the first electron transport layer 162 has a LUMO energy level of about −2.90 to −3.0 eV, which is higher than that of the compound of Formula 1, the compound of Formula 1 is preferably disposed closer to the cathode 180 in order to reduce the electron injection barrier.

Meanwhile, the benzimidazole derivative contained together with the compound of Formula 1 in the first electron transport layer 162 may be represented by the following Formula 2:

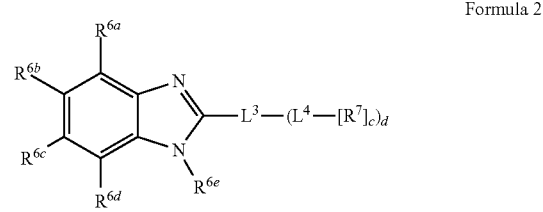

Formula 2

In Formula 2, $R^{6a}$, $R^{6b}$, $R^{6c}$, $R^{6d}$, and $R^{6e}$ are each independently selected from the group consisting of substituted or unsubstituted $C_1$-$C_{60}$ alkyl, substituted or unsubstituted aryl, and substituted or unsubstituted 5 to 7-atom heterocyclyl; $L^3$ and $L^4$ are each independently a direct bond, or a substituted or unsubstituted divalent, trivalent, or tetravalent arylene group; $R^7$ is a substituted or unsubstituted aryl group; c is, at each occurrence, independently 1, 2, or 3; and d is 1, 2, or 3.

Here, the first electron transport layer 162 including a mixture of benzimidazole derivative and compound of Formula 1 is a major component of the electron transport layer 160 and supplies electrons injected through the second electron transport layer 163 to the light emitting layer 150 at a high rate owing to the high electron mobility of the benzimidazole derivative.

Meanwhile, "OS", which is not described with regard to FIG. 1, means an organic stack which is a stack of the anode 110, the cathode 180 and a formed organic material. The electron injection layer 170 is made of a compound of an alkali metal such as LiF or $LiO_2$ and halogen as an inorganic material and may be excluded from the organic stack. The electron injection layer 170 may be formed together with the cathode 180.

Embodiments including the electron transport layer 160 and methods for forming the same will be described below.

Figure 2A:
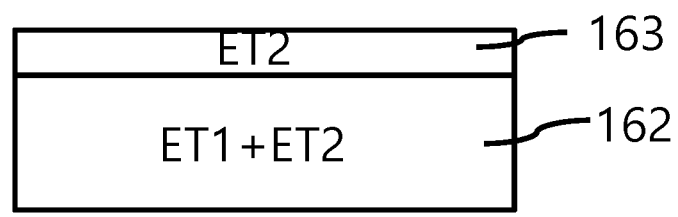
FIGS. 2A and 2B are sectional views illustrating another embodiment of the electron transport layer of FIG. 1.
Figure 2B:
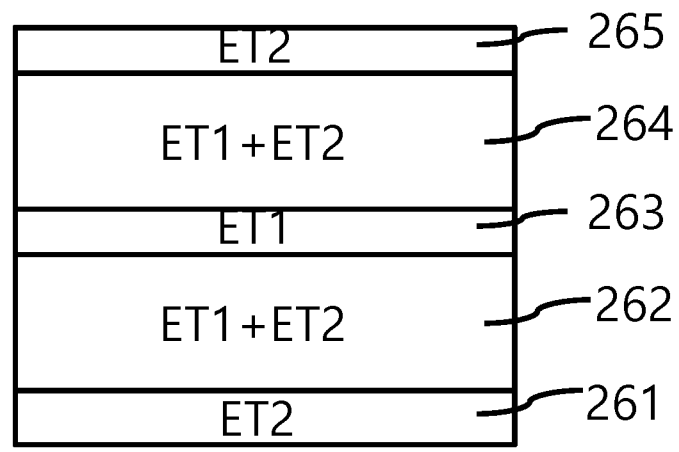
Figure 3A:
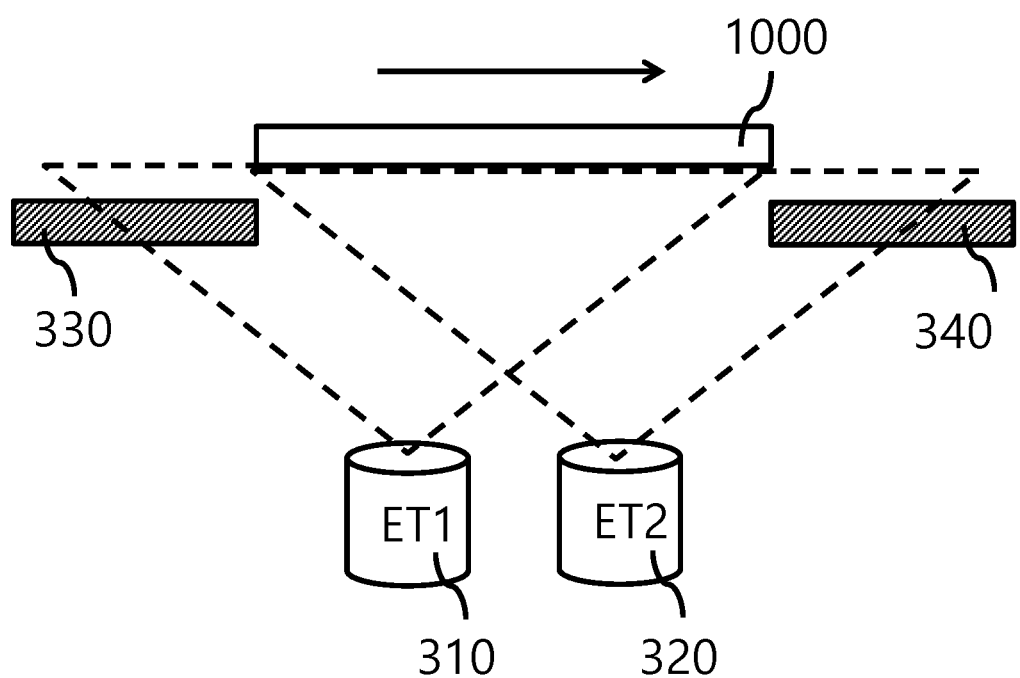
FIGS. 3A and 3B show the configuration of a process chamber for forming the electron transport layer shown in FIGS. 2A and 2B.
Figure 3B:
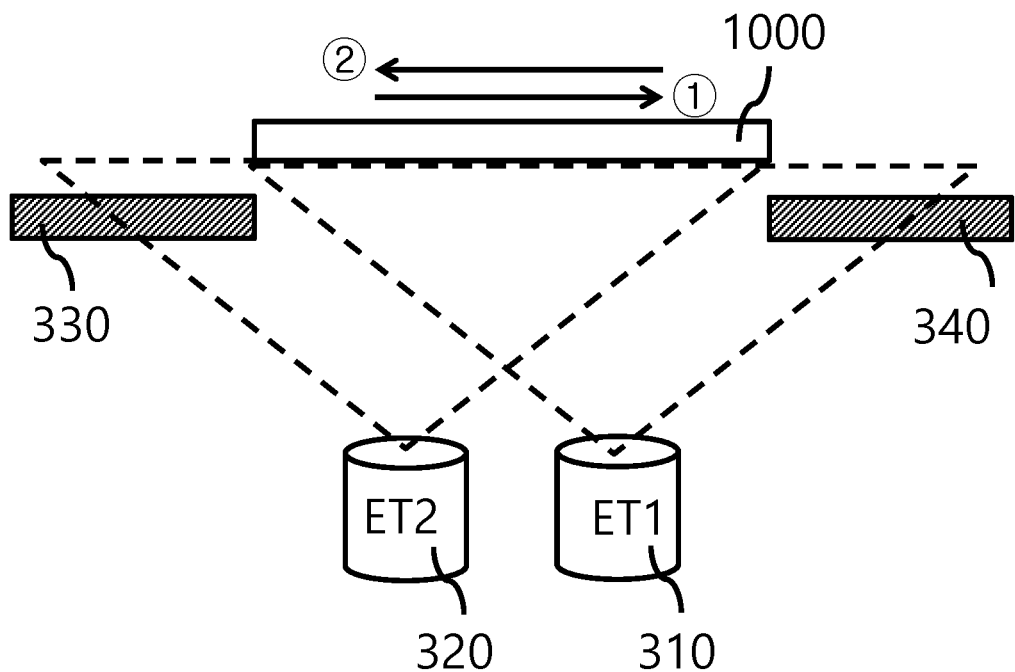

FIGS. 2A and 2B are sectional views illustrating another embodiment of the electron transport layer of FIG. 1, and FIGS. 3A and 3B show the configuration of a process chamber for forming the electron transport layer shown in FIGS. 2A and 2B.

As shown in FIG. 3A, a benzimidazole derivative source 310 and a compound of Formula 1 source 320 are provided under a substrate 1000, on which an organic material is deposited, in a chamber 600.

In addition, first and second control plates 330 and 340 to open deposition regions are spaced from each other between the substrate 1000 and the benzimidazole derivative and compound of Formula 1 sources 310 and 320, respectively.

Referring to FIG. 1, when benzimidazole and compound of Formula 1 are each supplied in the form of gases from benzimidazole derivative and compound of Formula 1 sources 310 and 320 toward the substrate 1000 in a deposition region, on the substrate 1000 where the anode 110 to the light emitting layer 150 are completely formed, an electron transport layer 160 is formed. When scanning the substrate 1000 from the left to the right, a third electron transport layer 161 made of a single material of the benzimidazole derivative and a second electron transport layer 163 made of the compound of Formula 1 is formed before and after a first electron transport layer 162 including a mixed layer of codeposited benzimidazole derivative and compound of Formula 1.

When deposition is conducted only in the region where the benzimidazole derivative and the compound of Formula 1 overlap each other by making the deposition region considerably narrow, only a first electron transport layer 162 of a mixed layer (comprising the benzimidazole derivative and the compound of Formula 1) could be formed. However, in this case, due to bad utilization efficiency of an organic material, the organic light emitting device shown in FIG. 1 is designed by allowing the organic material single layer to be left before and after the mixed layer during the process in order to maximize utilization efficiency of each compound source.

The organic light emitting device according to the present disclosure uses the effect of reducing barrier upon injection of electrons into the cathode 180, by disposing a second electron transport layer 163, which is a single layer of the compound of Formula 1, among the single layers formed during formation of the codeposited first electron transport layer 162, adjacent to the cathode 180.

Meanwhile, as shown in FIG. 2A, in order to reduce a constant electron injection barrier, the electron transport layer may contact the light emitting layer (150 of FIG. 1), without interposition of a single layer, and may have a double layer structure including a first electron transport layer 162, which is a mixed layer of benzimidazole derivative and compound of Formula 1, and a second electron transport layer 163 which is adjacent to the first electron transport layer 162 and is a single layer including a compound of Formula 1. In this case, the area of the first control plate 330 at the left side of FIG. 3A is increased and the second control plate 340 at the right side has an open region along a direction in which the process is conducted on the substrate 1000, so that, when, in an early stage, benzimidazole derivative and compound of Formula 1 are supplied from benzimidazole derivative and compound of Formula 1 sources 310 and 320 onto the substrate 1000 such that the benzimidazole derivative and compound of Formula 1 overlap, to form an electron transport layer 160 including the first electron transport layer 162, which is a mixed layer of benzimidazole derivative and compound of Formula 1, and the second electron transport layer 163, which is a thin single layer made of the compound of Formula 1 and continuously contacts the first electron transport layer 162.

The electron transport layer 160 may include four or more layers, which can be formed by alternating the single layer with the mixed layer while changing the scan direction of the substrate 1000 from left to right, from right to left, or from forward to reverse, not in one direction. At this time, left-right scanning of the substrate 1000 of FIG. 3B is used. That is, the electron transport layer can be provided with identical single layers 261 and 265 made of the compound of Formula 1 on both ends thereof by first scanning the substrate 1000 in a direction of ① to form, as shown in FIG. 2B, a first layer 261, which is a single layer made of the compound of Formula 1, a second layer 262 which is a mixed layer made of benzimidazole and the compound of Formula 1, and a third layer 263, which is a single layer made of the benzimidazole derivative, and by then scanning the substrate 1000 in a direction of ② which is reverse to the direction ①, to form a fourth layer 264, which is a mixed layer made of the benzimidazole derivative and the compound of Formula 1, and a fifth layer 265, which is a single layer made of the compound of Formula 1.

In addition, the structure shown in FIG. 2B is advantageous in that, when the single layer of the compound of Formula 1 is close to the cathode, electron injection efficiency is improved, and the compound of Formula 1 has a low HOMO level (a high absolute value of HOMO level) of −6.00 to −6.10 eV and thus prevents isolation of holes from the light emitting layer 150 and deterioration in lifespan due to improved recombination between holes and electrons in the light emitting layer 150.

In some cases, when extending the application of the structure shown in FIG. 2B, the electron transport layer may include a plurality of mixed layers (see 262 and 264 of FIG. 2B) of benzimidazole derivative and the compound of Formula 1, and a single layer made of the compound of Formula 1 and a single layer made of the benzimidazole derivative at both sides of each mixed layer.

In this case, as shown in FIG. 2B, the layer closest to the light emitting layer (see 150 of FIG. 1), among the electron transport layers, is preferably a single layer made of the compound of Formula 1 because isolation of holes from the light emitting layer can be prevented. The layer closest to the cathode (see 180 of FIG. 1) is preferably a single layer made of the compound of Formula 1 in terms of improvement in efficiency of electron injection.

In any embodiment, the organic light emitting device according to the present disclosure includes a stack configuration including a first electron transport layer (or mixed layer 262 or 264), as a mixed layer, and a second electron transport layer (163 or ET2 single layer 261 or 254) made of a compound of Formula 1, as a single layer, and utilizes the effect of reducing barrier upon injection of electrons by disposing the second electron transport layer 163 as the single layer made of the compound of Formula 1 to be close to the cathode 180. Accordingly, the organic light emitting device can maintain the electron injection efficiency over time, thereby maintaining lifespan. That is, the compound of Formula 1 used as the material of the mixed layer according to the present disclosure functions to improve lifespan.

In addition, in any embodiment, the first electron transport layer 162 formed as a mixed layer is formed to a greater thickness than that of the single layer for sufficient and stable transportation of electrons.

In addition, the benzimidazole derivative and the compound of Formula 1 are compounds resistant to UV, unlike lithium quinolate (Liq), and when these compounds are used as materials for codeposition of the electron transport layer 160, the electron transport layer can be stably operated even under outdoor environments involving long-time exposure to room temperature or UV.

Figure 4:
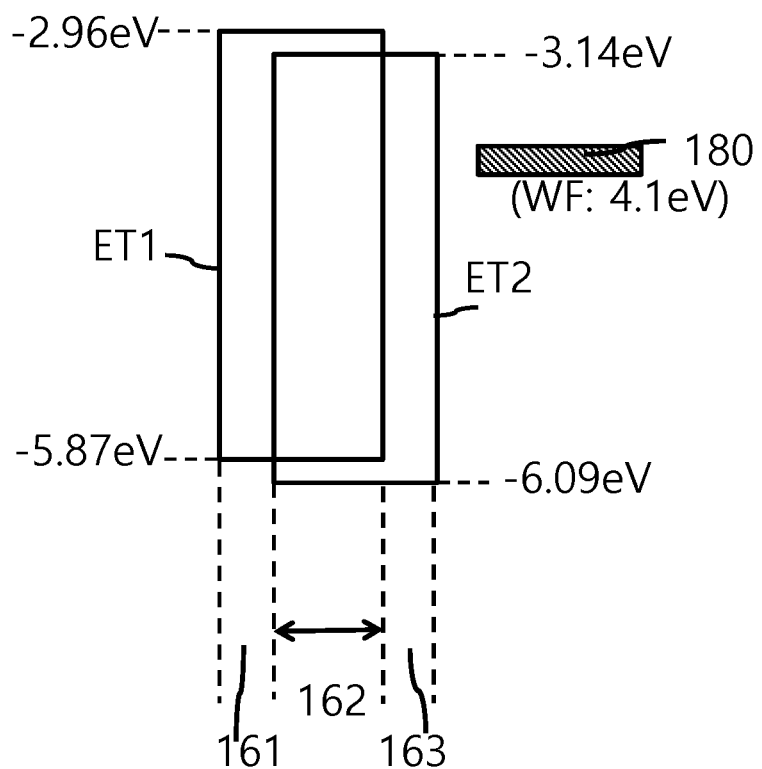
FIG. 4 is a band diagram showing first and compounds of Formula 1 constituting the electron transport layer of FIG. 1.

FIG. 4 is a band diagram showing the benzimidazole derivative and compound of Formula 1 constituting the electron transport layer of FIG. 1.

The benzimidazole derivative having the structure of Formula 2 and may be, for example, 2-[3-(10-naphthalene-2-yl-anthracene-9-yl)-phenyl]-1-phenyl-1H-benzimidazole, 2-(4-iodophenyl)-1-phenyl-1H-benzimidazole, or 1-(2-pyridyl)-2-(4-bromophenyl)-1H-benzimidazole.

| Compound Name | Compound Structure |
| --- | --- |
| 2-[3-(10-naphthalene-2-yl-anthracene-9-yl)-phenyl]-1-phenyl-1H-benzimidazole | 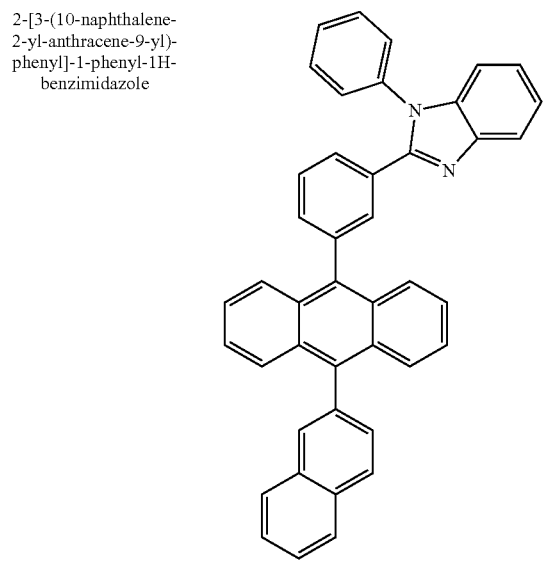 |
| 2-(4-iodophenyl)-1-phenyl-1H-benzimidazole | 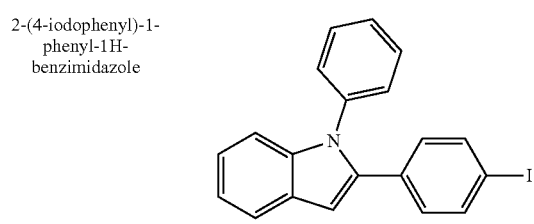 |

-continued

| Compound Name | Compound Structure |
| --- | --- |
| 1-(2-pyridyl)-2-(4-bromophenyl)-1H-benzimidazole | |

In addition, as shown in FIG. 4, the LUMO energy level of the benzimidazole derivative is about −3.0 eV to −2.9 eV, which is higher than −3.2 eV to −3.1 eV, which is a LUMO energy level of the compound of Formula 1 (when comparing the LUMO energy level, based on the absolute value, the LUMO level of the compound of Formula 1 is great). In the illustrated example, comparison in LUMO and HOMO energy levels of respective materials is shown under conditions that the benzimidazole derivative and the compound of Formula 1 are each limited to certain materials of Formulae 2 and 1, a third electron transport layer 161 is stacked as a single layer of the benzimidazole derivative, a first electron transport layer 162 is stacked as a mixed layer of benzimidazole derivative and the compound of Formula 1, and a second electron transport layer 163 is stacked as a single layer made of the compound of Formula 1. The benzimidazole derivative has a LUMO level of −2.96 eV and a HOMO level of −5.87 eV, and the compound of Formula 1 has a LUMO level of −3.14 eV and a HOMO level of −6.09 eV, that is, certain values of LUMO and HOMO energy levels of respective materials are shown. By changing substituted groups contained in respective compounds, although the shown HOMO and LUMO levels undergo variation within 0.1 eV, similar properties can be obtained.

In addition, since the benzimidazole derivative used for the electron transport layer of the present disclosure has a high electron mobility of $10^{-4}$ cm²/V·s or more which is higher than the electron mobility of the compound of Formula 1, transport of electrons into the first electron transport layer 162 depends on the benzimidazole derivative. Here, the second electron transport layer 163 contacting the first electron transport layer 162 has an electron mobility of about $10^{-6}$ cm²/V·s to $10^{-5}$ cm²/V·s.

The organic light emitting device according to the present disclosure has the properties of LUMO energy level and the electron mobility as described above, and is characterized in that the material is chosen as the compound of Formula 1 that can be stable even under certain environments involving exposure to room temperature or UV irradiation, when mixed with the benzimidazole derivative (ET1) in the first electron transport layer 162.

Meanwhile, FIG. 4 shows that the cathode 180 has a work function of 4.1 eV, when the cathode 180 is AgMg. The work function of the cathode 180 may change from 3 eV to 5.5 eV. The organic light emitting device according to the present disclosure can improve electron injection efficiency by decreasing the energy barrier when injecting electrons from the cathode, because the absolute value of the LUMO level of the compound of Formula 1 (ET2) is similar to or slightly different from the work function of the cathode 180.

Hereinafter, Comparative Example will be compared with the organic light emitting device according to the present disclosure.

Figure 5:
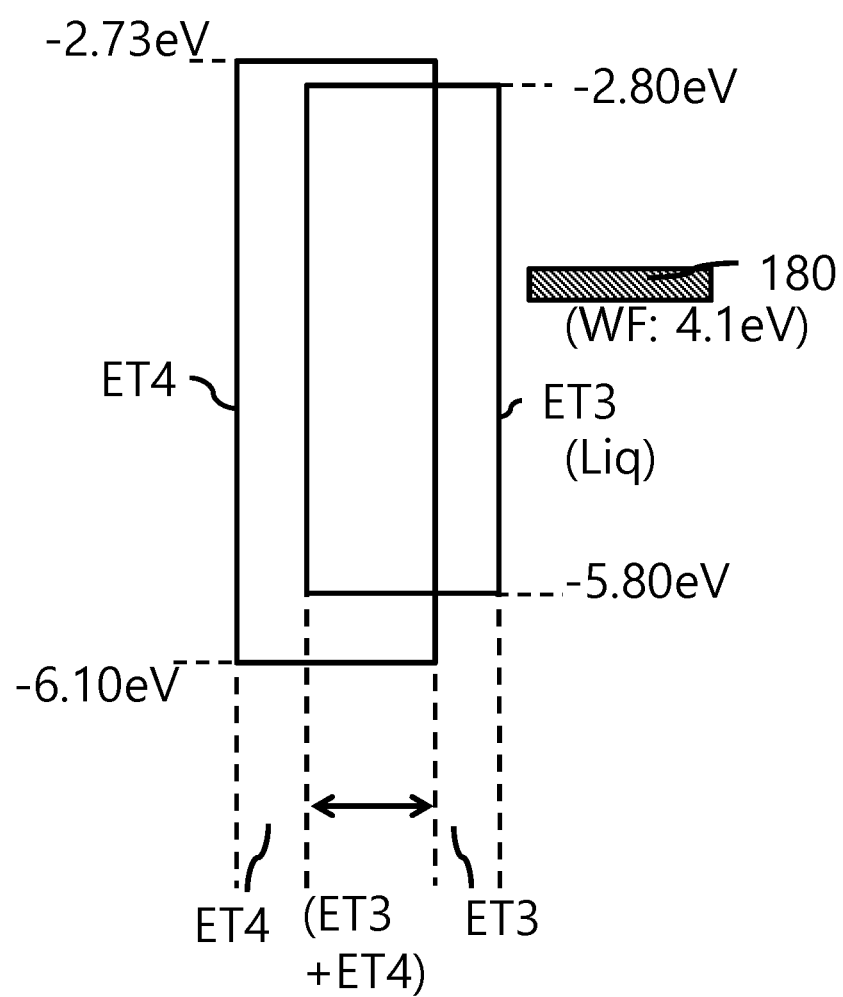
FIG. 5 is a band diagram of a third compound and a fourth compound constituting the electron transport layer of the organic light emitting device according to Comparative Example.

FIG. 5 is a band diagram of a third compound and a fourth compound constituting the electron transport layer of the organic light emitting device according to Comparative Example.

The organic light emitting device according to Comparative Example has the same stack structure as in FIG. 1, excluding the materials for the electron transport layer.

The organic light emitting device according to Comparative Example uses, as the material for the electron transport layer, a mixed layer of a third compound ET3 of lithium quinolate (Liq) and a fourth compound (ET4) of an electron transporting organic material having a wider bandgap including the bandgap of lithium quinolate.

Here, regarding the electron transport layer of the organic light emitting device according to Comparative Example, Liq, the third compound, has a LUMO level of −2.80 eV and a HOMO level of −5.80 eV, and the fourth compound of the electron transporting organic material has a LUMO level of −2.73 eV and a HOMO level of −6.10 eV.

The third compound of the electron transporting organic material of the organic light emitting device according to Comparative Example is a combination of generally well-known Alq3 and lithium quinolate (Liq). Here, lithium quinolate is an electron transporting material which is found to exhibit excellent electron injection upon operation at room temperature and to function to reduce driving voltage.

The electron transport layer including the material shown in FIG. 5 is formed as a mixed layer of a third compound, which is lithium quinolate, and a fourth compound, which is an electron transporting organic material having a wider bandgap including the bandgap of the lithium quinolate, and includes lithium quinolate (third compound) having a LUMO level at a lower side thereof to help injection of electrons, and the electron transporting fourth compound involved in transport of electrons.

In this regard, the organic light emitting device according to Comparative Example has advantages of high electron injection efficiency and low driving voltage, owing to a complex of Li, as an alkali metal, but rapidly changes electron injection of the organic light emitting device, when used under outdoor environments involving serious UV exposure in addition to operation at room temperature.

In addition, lithium quinolate (Liq) used in Comparative Example has a LUMO level of −2.8 eV, which causes a great difference between the absolute value of the LUMO level and the work function of the cathode, and the lithium quinolate thus has a greater barrier upon electron injection than that of the compound of Formula 1.

Figure 6A:
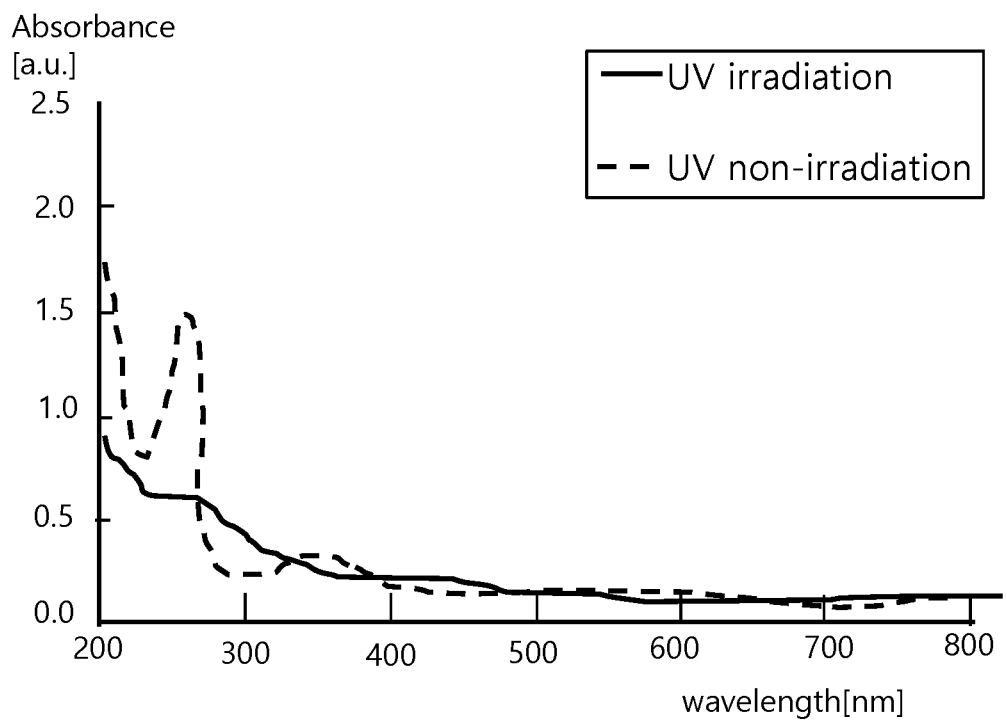
FIGS. 6A, 6B and 6C are graphs showing variations in absorbance spectra of a Liq material, a benzimidazole derivative and a compound of Formula 1, respectively, upon UV non-irradiation and UV irradiation.
Figure 6B:
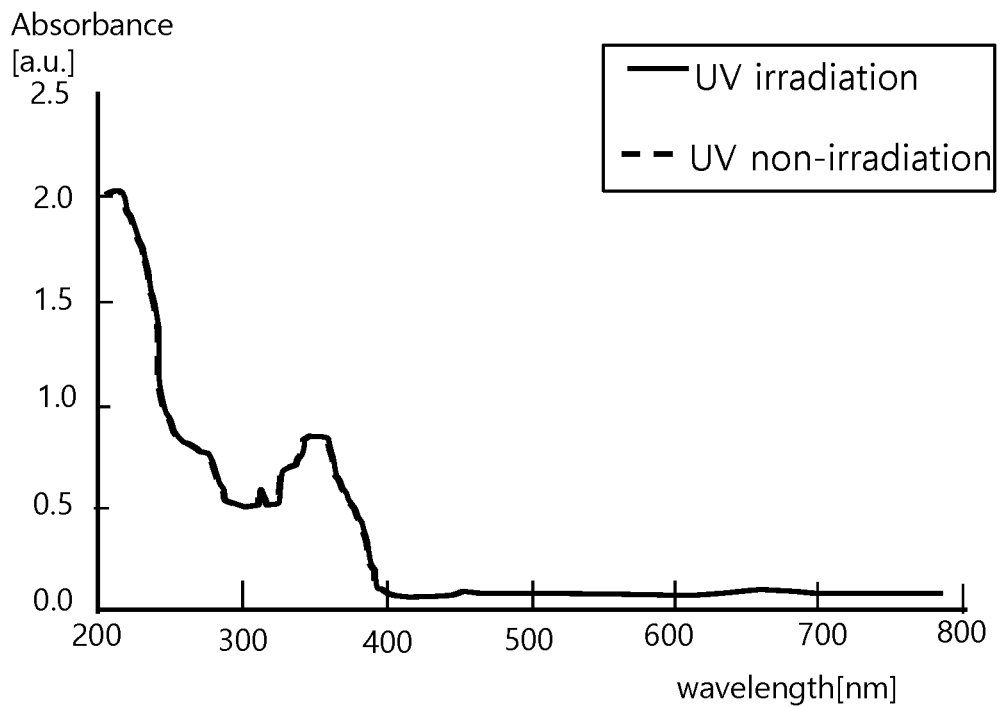
Figure 6C:
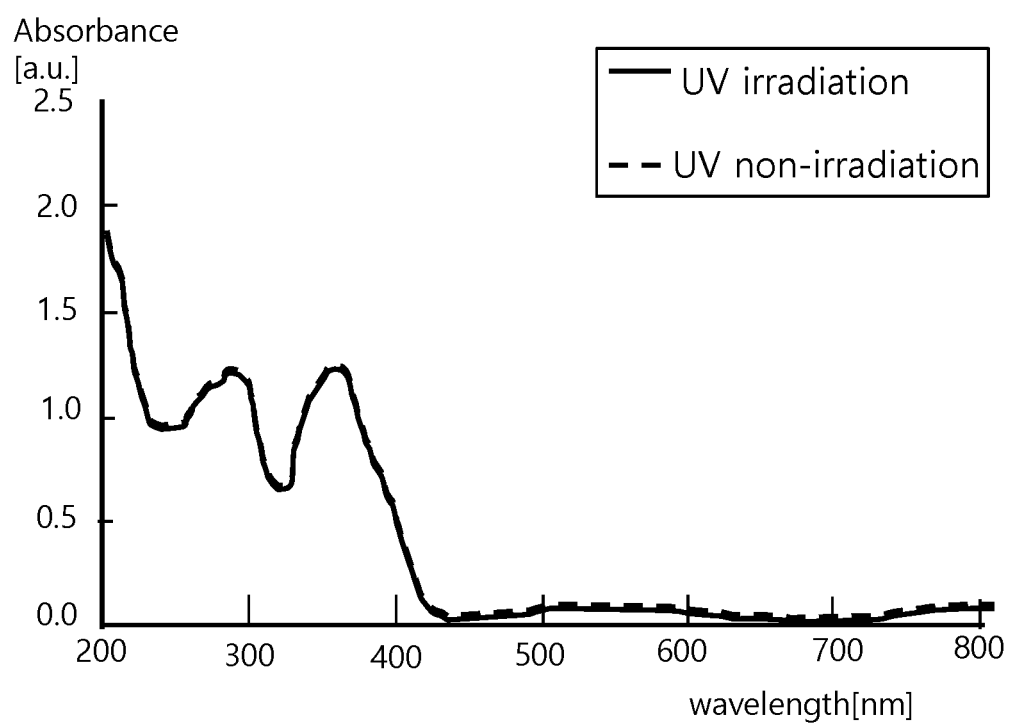

FIGS. 6A, 6B and 6C are graphs showing variations in absorbance spectra of a Liq material, a benzimidazole derivative and a compound of Formula 1, respectively, upon UV non-irradiation and UV irradiation.

FIGS. 6A to 6C show absorbance as a function of wavelength before and after UV irradiation at an intensity of 0.8 W/m² for 150 hours, after deposition of respective materials to a thickness of 1,000 Å.

As shown in FIG. 6A, there is the difference in absorbance between UV non-irradiation and irradiation within the UV range of 350 nm or less, upon use of lithium quinolate (Liq). That is, absorbance of lithium quinolate within the certain wavelength range of 350 nm or less is halved upon UV irradiation, which means that light emission capability is deteriorated and reliability is low under UV irradiation environment, upon UV exposure for a predetermined period of time or longer, when using lithium quinolate for the organic light emitting device.

In particular, in consideration of materials for the mixed layer, when a mixed layer is formed by mixing lithium quinolate (Liq) with other organic materials, a single layer made of lithium quinolate is formed in the codeposition process. The single layer made of lithium quinolate maintains its inherent properties, causing the aforementioned deterioration in absorbance shown in FIG. 6A under UV irradiation environment, which makes lithium quinolate having high efficiency at room temperature to be unsuitable as the material for the electron transport layer.

On the other hand, the benzimidazole derivative involved in the electron mobility of the electron transport layer 160 according to the present disclosure, and the compound of Formula 1 involved in improvement in electron injection and lifespan have no difference in absorbance between before and after UV irradiation, as shown in FIGS. 6B and 6C.

That is, the benzimidazole derivative and the compound of Formula 1 each have identical absorbance peak characteristics before and after UV irradiation at a wavelength of 200 nm to 400 nm. Accordingly, the organic light emitting device that includes a single layer made of a benzimidazole derivative and a single layer made of a compound of Formula 1, which are formed and remain in the codeposition process, before and after the mixed layer of a benzimidazole derivative and a compound of Formula 1, does not undergo variation in light-emission properties upon exposure to UV for a long time and thus serves as an organic light emitting device having reliability under outdoor environments.

Figure 7:
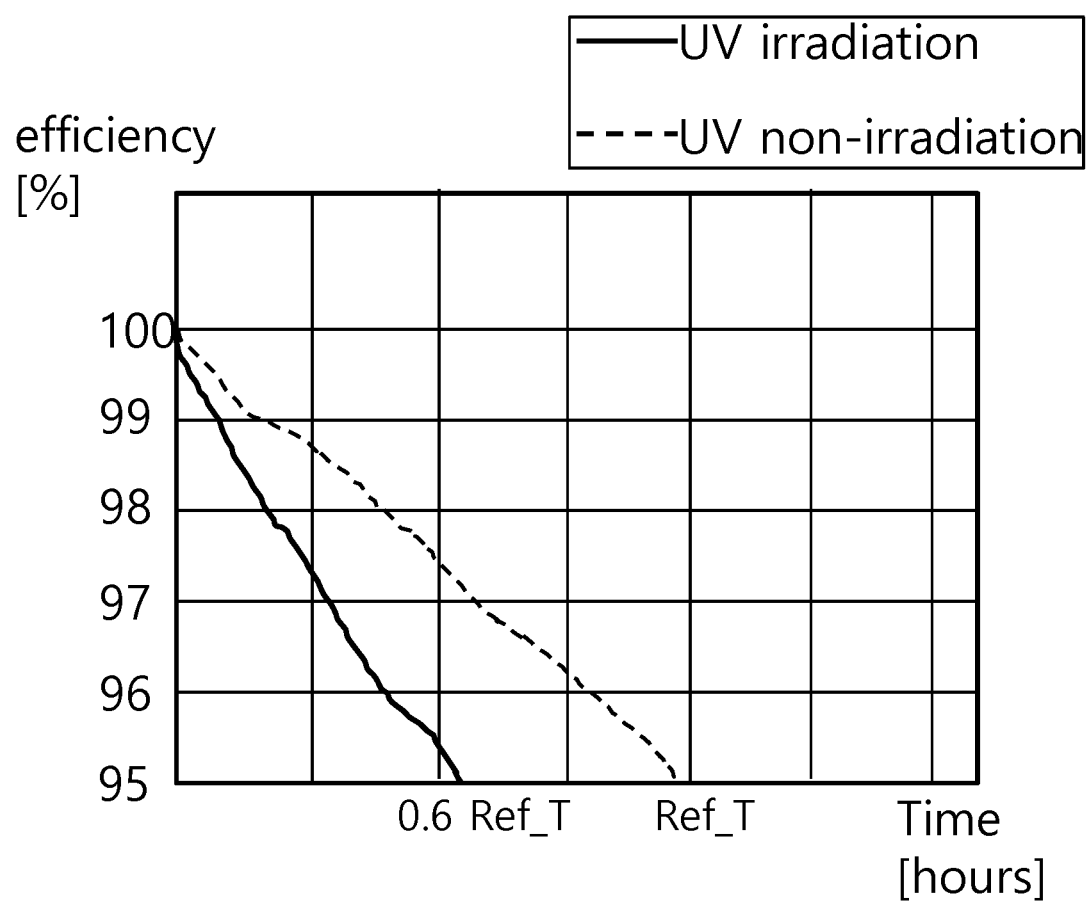
FIG. 7 is a graph showing lifespan upon UV non-irradiation and irradiation in the organic light emitting device according to Comparative Example.

FIG. 7 is a graph showing lifespan upon UV non-irradiation and irradiation in the organic light emitting device according to Comparative Example.

Comparative Example relates to formation of an electron transport layer as a mixed layer of the third compound (ET3: Liq) and the fourth compound (ET4) illustrated in FIG. 5, and shows a structure in which the single layer of the third compound and the single layer of the fourth compound are formed, before and after the mixed layer, during the codeposition process.

As shown in FIG. 7, the organic light emitting device of Comparative Example shows a decrease in lifespan upon UV irradiation which corresponds to 60% of lifespan upon UV non-irradiation.

Accordingly, the inventors of the present disclosure considered the formation of an electron transport layer with a single electron transporting organic material like a benzimidazole derivative, while excluding lithium quinolate from the material for the electron transport layer.

Figure 8:
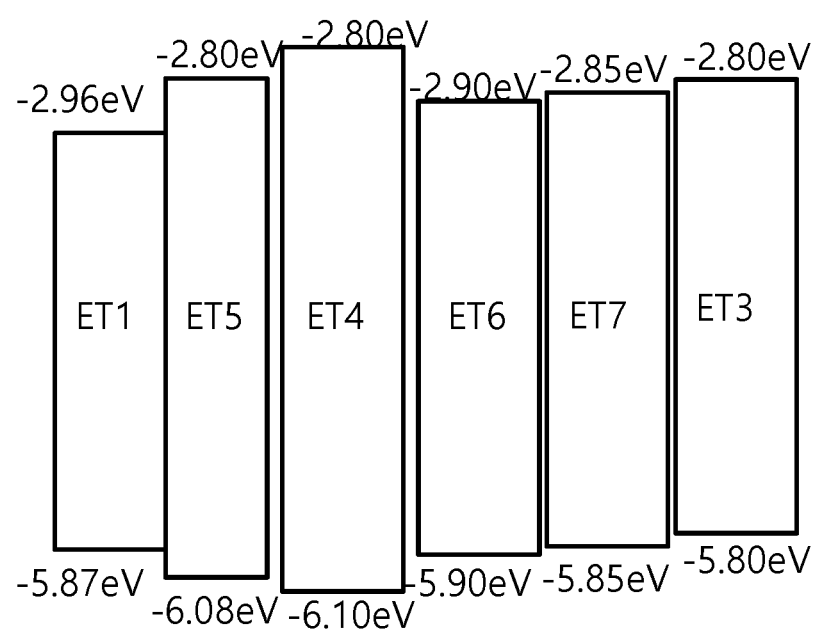
FIG. 8 is a band diagram of electron transporting materials used for the first Experiment.
Figure 9:
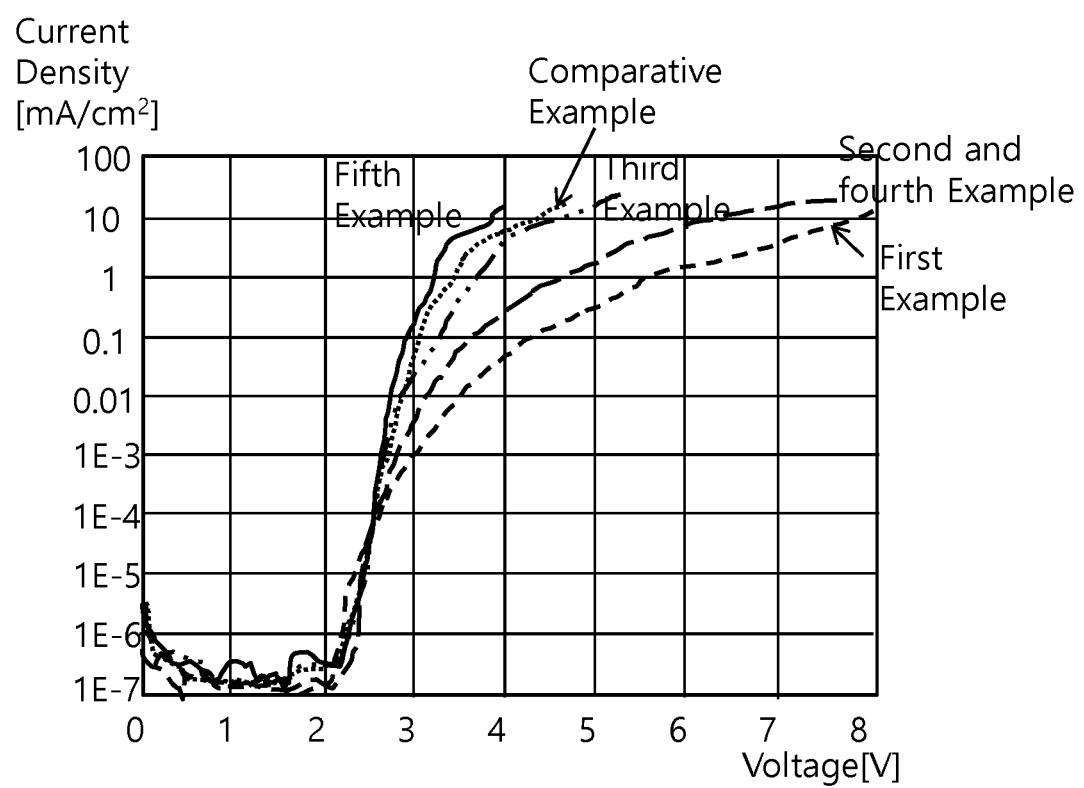
FIG. 9 is a graph showing current density as a function of voltage, in various Examples used for the first Experiment.
Figure 10:
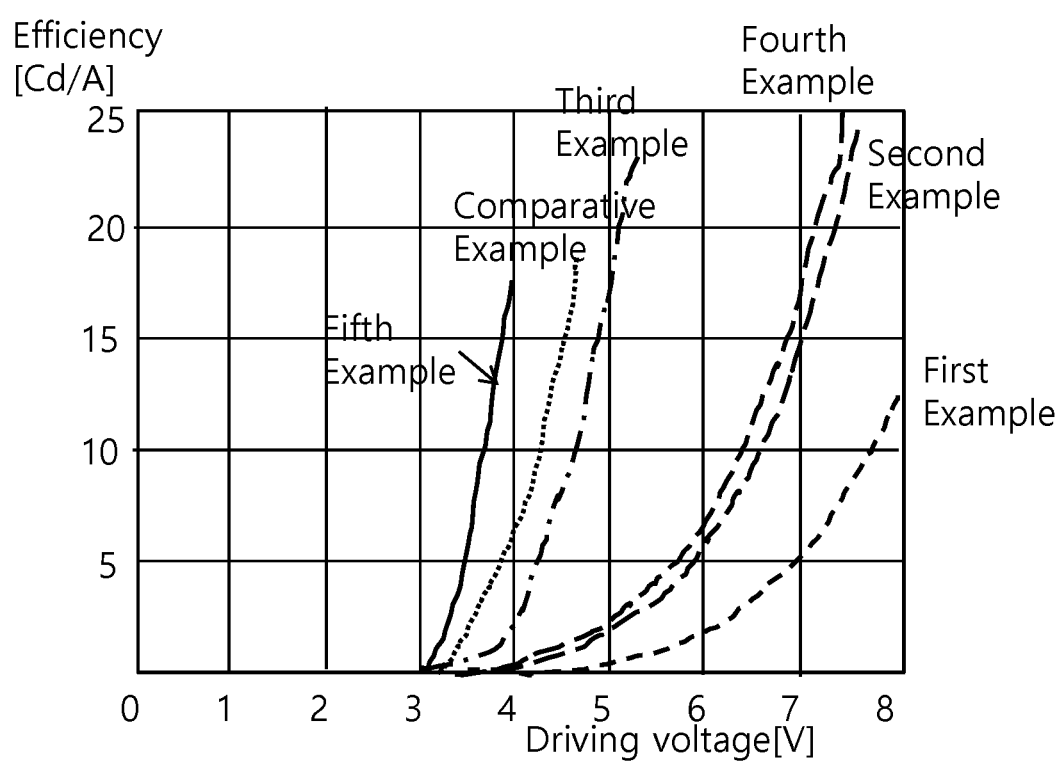
FIG. 10 is a graph showing luminous efficiency as a function of voltage, in various Examples used for the first Experiment.

FIG. 8 is a band diagram of the electron transporting materials used for the first Experiment and FIG. 9 is a graph showing current density as a function of voltage, in Examples used for the first Experiment. In addition, FIG. 10 is a graph showing luminous efficiency as a function of voltage in various Examples used for the first Experiment.

Referring to FIG. 8, considering the bandgap of the organic material of the electron transporting materials used for tests, in comparison with lithium quinolate, the third compound, Liq, included in the electron transport layer of Comparative Example, has a LUMO energy level of −2.80 eV and a HOMO energy level of −5.80 eV, and the fourth compound included in the electron transport layer of Comparative Example has a LUMO energy level of −2.73 eV and a HOMO energy level of −6.10 eV.

In addition, a single electron transport layer is formed using the fourth compound, and the comparison in driving voltage, efficiency and lifespan between First Examples and Comparative Example is shown in Table 1.

In the same manner as in the fourth compound, an electron transport layer is formed using a single material of fifth to seventh compounds, and the comparison in driving voltage, efficiency and lifespan between Second to Fourth Examples and Comparative Example is shown in Table 1.

The fifth compound has a LUMO energy level of −2.80 eV and a HOMO energy level of −6.08 eV, the sixth compound has a LUMO energy level of −2.90 eV and a HOMO energy level of −5.90 eV, and the seventh compound has a LUMO energy level of −2.85 eV and a HOMO energy level of −5.85 eV.

The Fifth Example is an example in which the electron transport layer is made of only the benzimidazole derivative shown in FIG. 1, and its LUMO energy level is −2.96 eV and its HOMO energy level is −5.87 eV. The benzimidazole derivative used for Fifth Example is a benzimidazole derivative, for example, 2-[3-(10-naphthalene-2-yl-anthracene-9-yl)-phenyl]-1-phenyl-1H-benzimidazole. However, any alternative material may be used as the benzimidazole derivative so long as it is a benzimidazole derivative represented by Formula 2 described above.

TABLE 1

| | | Blue driving (By: 0.045) | | |
|---|---|---|---|---|
| Example NO. | Electron transport layer structure | Driving voltage (V) | Efficiency (Cd/A) | Room-temperature lifespan (T95) |
| Comparative Example | Liq (third compound) + fourth compound | Refv | 100% | 100% |
| First Example | Fourth compound | Refv + 4.3 | 57% | 5% |
| Second Example | Fifth compound | Refv + 2.9 | 66% | 5% |
| Third Example | Sixth compound | Refv + 0.7 | 72% | 5% |
| Fourth Example | Seventh compound | Refv + 2.8 | 63% | 5% |
| Fifth Example | benzimidazole derivative | Refv − 0.6 | 100% | 70% |

Referring to Table 1, even when using only the single benzimidazole derivative, superior driving voltage and efficiency properties are obtained, that is, blue driving voltage is lower and efficiency is comparably excellent, compared to Comparative Example involving a mixture of two materials, but room-temperature lifespan is low (70% level), compared to the electron transport layer of the mixed layer including lithium quinolate. In addition, when forming the electron transport layer with the single organic material, excluding the benzimidazole derivative (First to Fourth Examples), all cases show a great deterioration in room-temperature lifespan which correspond to 5% of Comparative Example.

Considering JV properties shown in FIGS. 9 and 10, when one of fourth to seventh compounds in First to Fourth Examples is used for the electron transport layer, the driving voltage is increased and there is difficulty in improving current density even with increasing voltage.

On the other hand, as shown in FIGS. 9 and 10, when the electron transport layer is formed using a single material (a benzimidazole derivative), driving voltage and efficiency are excellent. This might be due to the fact that the electron mobility of the benzimidazole derivative has a higher electron mobility than fourth to seventh compounds and a LUMO level slightly different from the work function of the cathode.

TABLE 2

| Electron mobility ($cm^2/V \cdot s$) | |
|---|---|
| Fourth compound | $3.0 \times 10^{-5}$ |
| Fifth compound | $9.7 \times 10^{-5}$ |
| Sixth compound | $5.5 \times 10^{-5}$ |
| Seventh compound | $2.4 \times 10^{-5}$ |
| benzimidazole derivative | $2.7 \times 10^{-4}$ |

However, as can be seen from Table 1, the Fifth Example, wherein an electron transport layer is formed using only a benzimidazole derivative as a single material, exhibits worse room-temperature lifespan than Comparative Example. In an attempt to improve room-temperature lifespan, the organic light emitting device according to the present disclosure includes incorporation, into the electron transport layer, a mixed layer of the benzimidazole derivative and the compound of Formula 1 having different electron transporting properties from the benzimidazole derivative.

Meanwhile, tests are conducted using the material used for the benzimidazole derivative, for example, 2-[3-(10-naphthalene-2-yl-anthracene-9-yl)-phenyl]-1-phenyl-1H-benzimidazole. Any alternative material may be used as the benzimidazole derivative represented by Formula 2 described above.

Figure 11:
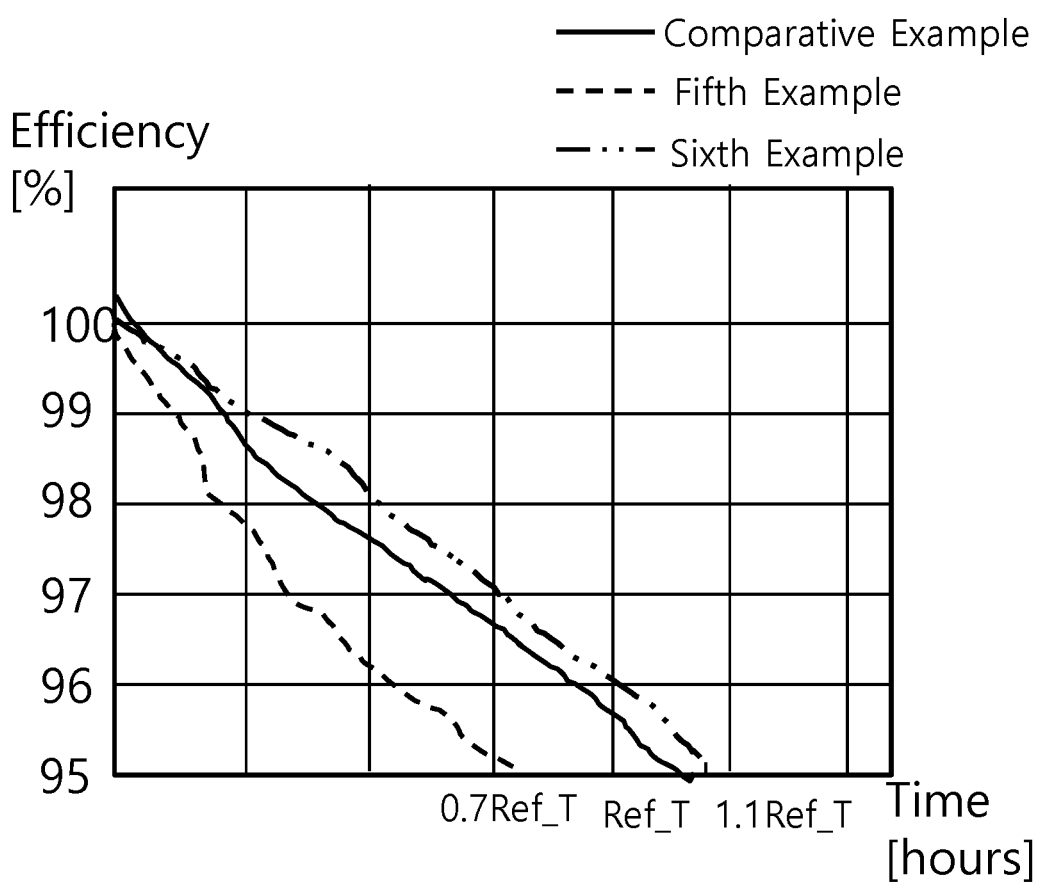
FIG. 11 is a graph showing lifespan upon blue driving in First Example, Fifth Example and Sixth Example.

FIG. 11 is a graph showing lifespan upon blue driving in First Example, Fifth Example and Sixth Example.

In the tests of FIG. 11 and Table 3, First Example and Sixth Example relate to tests using an electron transport layer 160 having a structure in which a third electron transport layer 161 made of a single material of a benzimidazole derivative, a first electron transport layer 162 made of a mixture material of the benzimidazole derivative and the compound of Formula 1, and a second electron transport layer 163 made of a single material of the compound of Formula 1 are stacked in this order, as shown in the structure of FIG. 1. On the other hand, Fifth Example relates to the electron transport layer 160 formed as a single layer made of the benzimidazole derivative.

As shown in FIG. 11 and Table 3, when the mixed layer of the electron transport layer is formed using the compound of Formula 1 in combination with the benzimidazole derivative, the driving voltage is 0.6V lower than Comparative Example due to properties of the benzimidazole derivative, efficiency is comparable to Comparative Example, and lifespan is increased to 110% or more. The lifespan is a lifespan at room temperature, and Sixth Example indicates that, as compared to Comparative Example, including a mixed layer of lithium quinolate, which is found to cause deterioration in driving voltage and improvement in efficiency at room temperature, as the material for the electron transport layer, and of the fourth compound, the present disclosure excludes lithium quinolate and adopts the electron transport layer including a mixed layer of the benzimidazole derivative and the compound of Formula 1, thereby stably operating under high UV exposure environments and securing excellent room-temperature lifespan.

TABLE 3

| | | Blue driving (By: 0.045) | | |
|---|---|---|---|---|
| Example NO. | Mixed layer structure | Driving voltage (V) | Efficiency (Cd/A) | Lifespan (T95) |
| Comparative Example | Third compound (Liq + fourth compound) | Refv | 100% | 100% |

TABLE 3-continued

| | Structure | Blue driving (By: 0.045) | | |
|---|---|---|---|---|
| Example NO. | Mixed layer structure | Driving voltage (V) | Efficiency (Cd/A) | Lifespan (T95) |
| Fifth Example | benzimidazole derivative | Refv − 0.6 | 100% | 70% |
| Sixth Example | benzimidazole derivative + compound of Formula 1 | Refv − 0.6 | 100% | 110% |

Meanwhile, a material having the structure of the following Formula 3 is used as the compound of Formula 1 used for Sixth Example. However, the compound of Formula 1 of the electron transport layer according to the present disclosure is not limited to the compound represented by the following Formula 3 and any material, which includes the structure of Formula 1 and has the difference of 0.1 eV or less in each LUMO and HOMO levels described in FIG. 4, can exhibit similar efficiency and lifespan.

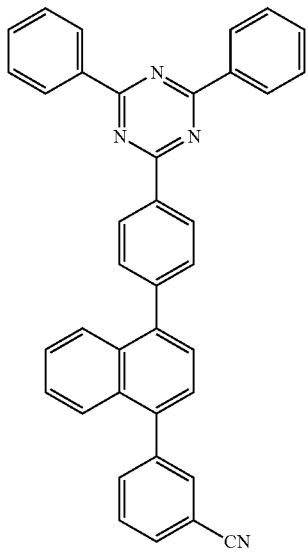

Formula 3

Meanwhile, the organic light emitting device according to the present disclosure shown in FIG. 1 may be electrically connected to a thin film transistor on the substrate so that it can be used for an organic light emitting display.

Figure 12:
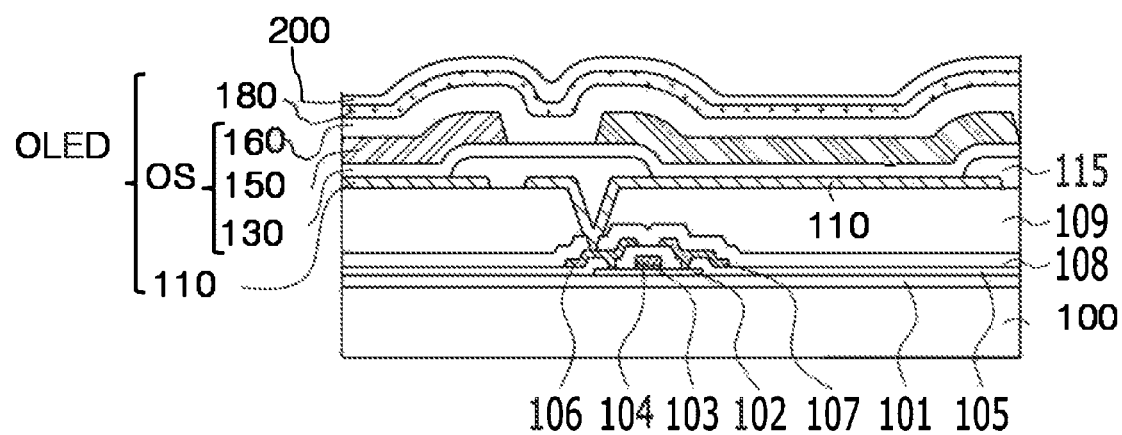
FIG. 12 is a sectional view illustrating an organic light emitting display including the organic light emitting device according to the present disclosure.

FIG. 12 is a sectional view illustrating an organic light emitting display including the organic light emitting device according to the present disclosure.

As shown in FIG. 11, the organic light emitting display according to the present disclosure includes a plurality of sub-pixels on a substrate 100 and an organic light emitting device connected to a driving transistor in each sub-pixel.

In addition, each sub-pixel includes an anode 110 connected to a transistor, an organic stack (OS: a hole transport layer 130, a light emitting layer 150, an electron transport layer 160) shown in FIG. 1, and a second electrode 180 in this order. The shown organic stack (OS) does not include a hole injection layer, an electron blocking layer, and an electron injection layer, but may include or not include these layers, if necessary. In addition, the electron transport layer 160, as shown in FIGS. 1 to 2B, includes a first electron transport layer 162, which is a mixed layer of the benzimidazole derivative of Formula 2 and the compound of Formula 1 including a heteroarylene group of Formula 1, and a second electron transport layer 163, which is a single layer made of a compound of Formula 1.

Meanwhile, when considering the cross-section of a thin film transistor array including the transistor, the thin film transistor array includes, on a substrate 100, a transistor including a semiconductor layer 102 made of amorphous silicon or poly-silicon or an oxide semiconductor, a gate electrode 104 provided by forming a gate insulation film 103 on the semiconductor layer 102, and a drain electrode 106 and a source electrode 107 connected to both ends of the semiconductor layer 102. The transistor may include a driving transistor, a switching transistor and/or a sensing transistor, a light-emitting control transistor, or the like, and the drain electrode 106 of the driving transistor may be connected to the anode 110.

In addition, the thin film transistor array includes an interlayer insulation film 105, in a region excluding a contact area, between the semiconductor layer 102, and the drain electrode 106 and the source electrode 107, and an inorganic protective film 108 and an organic protective film 109 covering the drain electrode 106 and the source electrode 107, in a region excluding a part of the contact hole on the drain electrode 106, so that the anode 110 in the organic light emitting device provided in each sub-pixel on the transistor is connected to the drain electrode 106 through the contact hole.

In addition, a capping layer 200 is provided on the cathode 180 to protect the organic light emitting device (OLED) and out-coupling properties of the organic light emitting device (OLED).

In addition, in addition to the configuration shown in the drawings, the organic light emitting display may be further provided with a sealing layer for sealing on the capping layer 200.

The organic light emitting device and the organic light emitting display including the same according to the present disclosure have the following effects.

First, since organic light emitting devices developed to date are designed to be driven under optimal conditions at room temperature, they have problems of undergoing variation in electron injection over time and thus rapid deterioration in lifespan, even under outdoor environments involving prolonged UV exposure. The organic light emitting device according to the present disclosure can be stably operated even under harsh UV environments by mixing a novel electron transporting material which is capable of exhibiting high electron transporting performance and of reducing electron injection barrier, rather than lithium quinolate which has high efficiency at room temperature, but is vulnerable to UV, among the materials used for the electron transport layer.

Second, when forming an electron transport layer with a single electron transporting material, while avoiding electron transporting materials vulnerable to UV, disadvantageously, electron injection properties are changed over time and long-time driving is impossible. For this purpose, the electron transport layer is formed using a mixture of two or more materials for electron injection and electron transport by codeposition. During the codeposition process, a single material layer may be formed in the electron transport layer. The organic light emitting device according to the present disclosure can reduce the barrier and prevent change of electron injection properties by limiting the material adjacent to the cathode, among single material layers generated during the process.

Third, process stability can be obtained by avoiding materials, which are difficult to treat and are harmful, as a material for the electron transport layer.

In addition, although the preferred embodiments of the present disclosure have been disclosed for illustrative purposes with reference to the annexed drawings, it will be apparent to those skilled in the art that the present disclosure is not limited to the same configurations, actions and effects as the specific embodiments, and various modifications and variations can be made in the present disclosure without departing from the spirit and scope of the disclosure. Accordingly, it is intended that such modifications and alterations fall within the scope of the present disclosure and the true technical protection scope of the disclosure is defined by the technical spirit of the appended claims.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An organic light emitting device, comprising:
an anode and a cathode opposing each other;
a light emitting layer interposed between the anode and the cathode;
a hole transport layer interposed between the anode and the light emitting layer;
a first electron transport layer directly contacting with the light emitting layer, the first electron transport layer comprising a benzimidazole derivative and a compound of Formula 1;
a second electron transport layer directly contacting with the first transport layer, the second electron transport layer consisting of the compound of Formula 1;
an electron injection layer between the second electron transport layer and the cathode, wherein the second electron transport layer is in contact with a first surface of the electron injection layer, and an inner surface of the cathode is in contact with a second surface of the electron injection layer; and
a capping layer on an outer surface of the cathode,
wherein the compound of Formula 1 has the following structure:

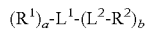  Formula 1 wherein:
a and b are each independently 1, 2 or 3;
$L^1$ is, at each occurrence, independently a substituted or unsubstituted divalent, trivalent, or tetravalent arylene group;
$L^2$ is a direct bond or a substituted or unsubstituted arylene group;
$R^2$ is a unsubstituted aryl or an aryl substituted with 1, 2, or 3 cyano substituents; and $R^1$ is a substituted or unsubstituted heteroaryl group,
wherein the electron transport layer is free of lithium quinolate,
wherein among the electron transport layer, the second electron transport layer is closest to an inner surface of the cathode, and
wherein a light generated between the anode and the cathode is emitted through the cathode and the capping layer.

2. The organic light emitting device according to claim 1, wherein:
the first electron transport layer is positioned to be more distal to the cathode relative to the second electron transport layer; and
the second electron transport layer is positioned to be more proximal to the cathode relative to the first electron transport layer.

3. The organic light emitting device according to claim 1, wherein the first electron transport layer is thicker than the second electron transport layer.

4. The organic light emitting device according to claim 1, wherein the benzimidazole derivative has a LUMO energy level ranging from −3.0 eV to −2.9 eV, and the compound of Formula 1 has a LUMO energy level ranging from −3.2 eV to −3.1 eV, wherein the LUMO energy levels of respective benzimidazole derivative and the compound of Formula 1 are obtained by measuring HOMO energy levels and bandgaps of the respective benzimidazole derivative and the compound of Formula 1, the HOMO energy levels being measured by cyclic voltammetry.

5. The organic light emitting device according to claim 1, wherein $R^1$ has the following Formula A or B:

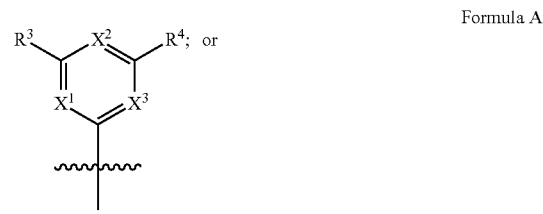  Formula A

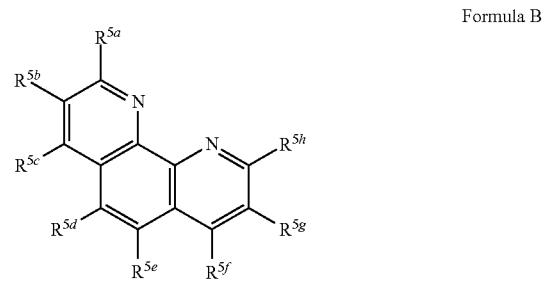  Formula B wherein:
$X^1$, $X^2$ and $X^3$ are, at each occurrence, independently N, CH or CD provided that at least one of $X^1$, $X^2$ or $X^3$ is N;
$R^3$ and $R^4$ are, at each occurrence, independently hydrogen, a substituted or unsubstituted aryl group; and
$R^{5a}$, $R^{5b}$, $R^{5c}$, $R^{5d}$, $R^{5e}$, $R^{5f}$, $R^{5g}$, and $R^{5h}$ are, at each occurrence, independently a direct bond to $L^1$, hydrogen, a substituted or unsubstituted aryl group, or two of $R^{5a}$, $R^{5b}$, $R^{5c}$, $R^{5d}$, $R^{5e}$, $R^{5f}$, $R^{5g}$, and $R^{5h}$ may join with each other, along with the carbon to which they are attached, to form a substituted or unsubstituted carbocyclic or heterocyclic ring.

6. The organic light emitting device according to claim 1, wherein the benzimidazole derivative has the following Formula 2:

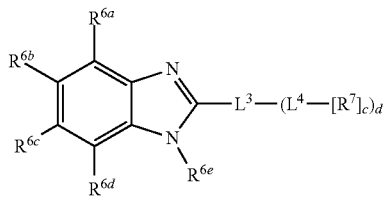
Formula 2 wherein:
$R^{6a}$, $R^{6b}$, $R^{6c}$, $R^{6d}$, and $R^{6e}$ are each independently selected from the group consisting of substituted or unsubstituted $C_1$-$C_{60}$ alkyl, substituted or unsubstituted aryl, and substituted or unsubstituted 5 to 7-atom heterocyclyl;
$L^3$ and $L^4$ are each independently a direct bond or a substituted or unsubstituted divalent, trivalent, or tetravalent arylene group;
$R^7$ is absent or a substituted or unsubstituted aryl group;
c is, at each occurrence, independently 1, 2, or 3; and
d is 1, 2, or 3.

7. The organic light emitting device according to claim 1, wherein an absolute value of a LUMO level of the compound of Formula 1 is higher than an absolute value of a LUMO level of the benzimidazole derivative and is lower than a work function of the cathode, wherein the LUMO energy levels of respective benzimidazole derivative and the compound of Formula 1 are obtained by measuring HOMO energy levels and bandgaps of the respective benzimidazole derivative and the compound of Formula 1, the HOMO energy levels being measured by cyclic voltammetry.

8. The organic light emitting device according to claim 1, wherein an electron mobility of the benzimidazole derivative is greater than $10^{-4}$ cm$^2$/V·s and an electron mobility of the compound of Formula 1 is less than $10^{-4}$ cm$^2$/V·s.

9. The organic light emitting device according to claim 1, wherein the benzimidazole derivative and the compound of Formula 1 each have identical absorbance peak characteristics before and after UV irradiation at a wavelength ranging from 200 nm to 400 nm.

10. An organic light emitting display, comprising:
a substrate having a plurality of sub-pixels positioned on a surface of the substrate;
a thin film transistor in each sub-pixel on the surface of the substrate; and
an organic light emitting device connected to the thin film transistors, the organic light emitting device comprising:
an anode and a cathode opposing each other;
a light emitting layer interposed between the anode and the cathode;
a hole transport layer interposed between the anode and the light emitting layer;
a first electron transport layer directly contacting with the light emitting layer, the first electron transport layer comprising a benzimidazole derivative and a compound of Formula 1;
a second electron transport layer directly contacting with the first transport layer, the second electron transport layer consisting of the compound of Formula 1;
an electron injection layer between the second electron transport layer and the cathode, wherein the second electron transport layer is in contact with a first surface of the electron injection layer, and an inner surface of the cathode is in contact with a second surface of the electron injection layer; and
a capping layer on an outer surface of the cathode,
wherein the second electron transport layer does not comprise the benzimidazole derivative,
wherein the compound of Formula 1 has the following structure:

$(R^1)_a$-$L^1$-$(L^2$-$R^2)_b$     Formula 1 wherein:
a and b are each independently 1, 2 or 3;
$L^1$ is, at each occurrence, independently a substituted or unsubstituted divalent, trivalent, or tetravalent arylene group;
$L^2$ is a direct bond or a substituted or unsubstituted arylene group;
$R^2$ is a unsubstituted aryl or an aryl substituted with 1, 2, or 3 cyano substituents; and
$R^1$ is a substituted or unsubstituted heteroaryl group,
wherein among the electron transport layer, the second electron transport layer singly comprising the compound of Formula 1 is closest to an inner surface of the cathode, and
wherein a light generated between the anode and the cathode emits through the cathode and the capping layer.

11. The organic light emitting display according to claim 10, wherein:
the first electron transport layer is positioned to be more distal to the cathode relative to the second electron transport layer; and
the second electron transport layer is positioned to be more proximal to the cathode relative to the second electron transport layer.

12. The organic light emitting display according to claim 10, wherein the benzimidazole derivative and the compound of Formula 1 each have identical absorbance peak characteristics before and after UV irradiation at a wavelength ranging from 200 nm to 400 nm.

* * * * *